United States Patent
Latypov et al.

(10) Patent No.: US 7,469,058 B2
(45) Date of Patent: Dec. 23, 2008

(54) METHOD AND SYSTEM FOR A MASKLESS LITHOGRAPHY RASTERIZATION TECHNIQUE BASED ON GLOBAL OPTIMIZATION

(75) Inventors: Azat Latypov, San Jose, CA (US); Sherman Poultney, Wilton, CT (US); Wenceslao Cebuhar, Danbury, CT (US)

(73) Assignee: ASML Holding N.V., Veldhoven (NL)

( * ) Notice: Subject to any disclaimer, the term of this patent is extended or adjusted under 35 U.S.C. 154(b) by 53 days.

(21) Appl. No.: 11/340,865

(22) Filed: Jan. 27, 2006
(Under 37 CFR 1.47)

(65) Prior Publication Data
US 2006/0209314 A1  Sep. 21, 2006

Related U.S. Application Data

(60) Provisional application No. 60/647,459, filed on Jan. 28, 2005.

(51) Int. Cl.
G06K 9/00 (2006.01)
G02F 1/1335 (2006.01)
G02F 1/135 (2006.01)
G21K 5/00 (2006.01)
G03C 5/20 (2006.01)
G02B 27/42 (2006.01)
G03H 1/12 (2006.01)
G03B 27/54 (2006.01)

(52) U.S. Cl. .............................. 382/144; 349/4; 349/30; 378/34; 430/396; 250/550; 359/11; 359/237; 355/67; 355/71

(58) Field of Classification Search .................. 382/144; 355/67, 71, 77, 53; 349/4, 30; 378/34; 430/396, 430/56; 250/550; 359/11, 237
See application file for complete search history.

(56) References Cited

U.S. PATENT DOCUMENTS 5,296,891 A * 3/1994 Vogt et al. .................... 355/67

(Continued)

FOREIGN PATENT DOCUMENTS

JP 2004-363598 A * 12/2004

(Continued)

OTHER PUBLICATIONS

Sandstrom, Tor, Arno Bleeker, Jason D. Hintersteiner, and Kars Troost. "OML: Optical Maskless Lithography for Economic Design Prototyping and Small-Volume Production". Proceedings of SPIE, vol. 5377. Optical Microlithography XVII: May 2004. pp. 777-787.*

(Continued)

*Primary Examiner*—Jingge Wu
*Assistant Examiner*—Manav Seth
(74) *Attorney, Agent, or Firm*—Sterne, Kessler, Goldstein & Fox P.L.L.C.

(57) ABSTRACT

Provided are a method and system for determining states of spatial light modulator (SLM) pixels in a lithography system configured to print a desired pattern. The method includes determining diffraction orders associated with an ideal mask of a pattern to be printed by the lithography system, and then configuring the states of the SLM pixels to match all the diffraction orders that are relevant in the image formation.

22 Claims, 8 Drawing Sheets

U.S. PATENT DOCUMENTS

| | | | |
|---|---|---|---|
| 6,057,639 A * | 5/2000 | May et al. ............... 313/371 |
| 6,177,980 B1 | 1/2001 | Johnson |
| 6,238,852 B1 | 5/2001 | Klosner |
| 6,247,037 B1 * | 6/2001 | O'Callaghan ............... 708/816 |
| 6,312,134 B1 | 11/2001 | Jain et al. |
| 6,399,261 B1 * | 6/2002 | Sandstrom ............... 430/30 |
| 6,424,388 B1 * | 7/2002 | Colgan et al. ............... 349/27 |
| 6,428,940 B1 * | 8/2002 | Sandstrom ............... 430/22 |
| 6,498,685 B1 | 12/2002 | Johnson |
| 6,624,880 B2 | 9/2003 | Sandstrom et al. ............... 355/71 |
| 6,707,534 B2 * | 3/2004 | Bjorklund et al. ............... 355/53 |
| 6,717,650 B2 * | 4/2004 | Jain ............... 355/53 |
| 6,764,796 B2 * | 7/2004 | Fries ............... 430/22 |
| 6,819,469 B1 | 11/2004 | Koba |
| 6,833,854 B1 * | 12/2004 | Sandstrom ............... 347/239 |
| 6,841,787 B2 * | 1/2005 | Almogy ............... 250/492.24 |
| 6,876,440 B1 * | 4/2005 | Bleeker et al. ............... 355/77 |
| 6,956,692 B2 * | 10/2005 | Duerr et al. ............... 359/298 |
| 6,963,434 B1 * | 11/2005 | Latypov ............... 359/237 |
| 6,992,754 B2 * | 1/2006 | Bleeker et al. ............... 355/67 |
| 7,012,674 B2 * | 3/2006 | Sewell ............... 355/67 |
| 7,061,226 B2 * | 6/2006 | Durr ............... 324/121 R |
| 7,061,591 B2 | 6/2006 | Bleeker et al. |
| 7,063,920 B2 * | 6/2006 | Baba-Ali ............... 430/5 |
| 7,094,506 B2 * | 8/2006 | Van Buel ............... 430/5 |
| 7,102,733 B2 * | 9/2006 | Latypov et al. ............... 355/67 |
| 7,106,490 B2 * | 9/2006 | Sandstrom ............... 359/290 |
| 7,110,082 B2 * | 9/2006 | Smirnov et al. ............... 355/53 |
| 7,153,616 B2 * | 12/2006 | Mason ............... 430/5 |
| 7,170,669 B1 * | 1/2007 | Jain et al. ............... 359/291 |
| 7,215,409 B2 * | 5/2007 | Sandstrom ............... 355/53 |
| 7,369,291 B2 * | 5/2008 | Karlin ............... 359/239 |
| 2002/0021426 A1 * | 2/2002 | Mei et al. ............... 355/53 |
| 2003/0206281 A1 * | 11/2003 | Jain ............... 355/53 |
| 2003/0210383 A1 * | 11/2003 | Bjorklund et al. ............... 355/53 |
| 2004/0135965 A1 | 7/2004 | Holmes |
| 2004/0239908 A1 * | 12/2004 | Bleeker et al. ............... 355/67 |
| 2005/0007677 A1 * | 1/2005 | Coston et al. ............... 359/663 |
| 2005/0024613 A1 * | 2/2005 | Bleeker ............... 355/67 |
| 2005/0068467 A1 * | 3/2005 | Bleeker et al. ............... 349/4 |
| 2005/0211919 A1 | 9/2005 | Galburt et al. |

FOREIGN PATENT DOCUMENTS

| | | |
|---|---|---|
| WO | WO 98/04950 A1 | 2/1998 |
| WO | WO 2006/083685 A2 | 8/2006 |

OTHER PUBLICATIONS

Azat Latypov, Ronald Albright, Nabila BabaAli, Wenceslao A. Cebuhar, Jason D. Hintersteiner, and Elizabeth Stone; "*Optical Rasterization Algorithms for Contrast Devices Utilizing Different Physical Modulation Principles in Optical Maskless Lithography*," Emerging Lithographic Technologies IX, edited by R. Scott Mackay, Proceedings of SPIE vol. 5751, pp. 1038-1049, (SPIE, Bellingham, WA, 2005).

Search Report, dated Feb. 26, 2007, for PCT Patent Application No. PCT/US06/02823, 9 pgs.

Shroff, et al., "Image Optimization for Maskless Lithography", *Emerging Lithographic Technologies VIII*, Proceedings of SPIE vol. 5374, 2004, pp. 637-647.

\* cited by examiner

○ ◉ ⊚ - the locations of the diffraction orders (d.o.s) generated by the ideal mask;

◉ ⊚ - the locations of the 1st period d.o.s generated by the graytoning squares;

⊚ - the locations of the essential d.o.s affecting the aerial image;

METHOD AND SYSTEM FOR A MASKLESS LITHOGRAPHY RASTERIZATION TECHNIQUE BASED ON GLOBAL OPTIMIZATION

CROSS-REFERENCE TO RELATED APPLICATIONS

This application claims benefit to U.S. Provisional Application No. 60/647,459, filed Jan. 28, 2005, entitled "Method and System for a Maskless Lithography Rasterization Technique Based On Global Optimization," which is incorporated by reference herein in its entirety.

BACKGROUND OF THE INVENTION

1. Field of the Invention

The present invention generally relates to the field of maskless lithography (MLL) and optical maskless lithography (OML).

2. Background Art

OML is an extension of conventional (i.e. mask-based) photolithography. In OML, however, instead of using a photomask, tens of millions of micro-mirror pixels on a micro-electro-mechanical systems (MEMS) device are dynamically actuated in real-time to generate the desired pattern. Due to a fixed grid imposed by the pixels and use of short-pulse duration excimer lasers at deep ultra-violet (DUV) wavelengths, spatial modulation of gray scales is required. These classes of MEMS devices are therefore known as spatial light modulators (SLMs).

SLMs may utilize one of several geometrical actuation types (e.g. tilt, piston, etc.) for creating images. By using the same wavelengths and resists as conventional mask-based photolithography scanners, OML is directly compatible with existing line facilities and can be integrated into existing fabrication facilities with the same track and etch equipment. OML provides more design turns in less time to facilitate optimization of chip yields and speed.

One important conceptual difference between OML and traditional mask-based lithography stems from the differences between the SLMs used in OML, and the traditional masks. The SLMs consist of many pixels, with each pixel having an ability to vary its optical properties in a controllable manner. Typically, each pixel is sub-resolution in size and can assume one of many possible states. Some SLM designs utilize the physical principles of light modulation that are not necessarily equivalent to the ones utilized in a design of traditional masks. For instance, tilting mirror pixels operate by varying the degree of light deflection, which is not necessarily equivalent to a fragment of a traditional mask.

In addition to defining the necessary specifications of the SLM itself, one of the main challenges in OML is to understand how best to use the SLM pixels to reproduce the desired pattern. Rasterization, which presents significant challenges in this area, is one technique used to configure SLM pixels to reproduce patterns. More specifically, given the description of a mask pattern or the desired properties of an image, it is not an easy task to determine the states of the SLM pixels that result in that mask pattern, or that most closely approximate the desired image.

Several approaches to OML rasterization have been described in the literature. One such approach is image optimization. Image optimization attempts to solve the optimization problem by performing iterations of the pixel states to optimally print a desired pattern while accounting for feature proximity effects and optical interference between the pixels. On a conceptual level, this approach follows many techniques utilized for optical proximity effect correction (OPC) features designed for traditional masks.

Because the objective function of the optimization can be formulated in terms of the properties of an aerial image (or possibly even in terms of the image in resist), the image optimization approach allows relatively precise control of the desired properties of the pattern to be printed. In principle, to achieve optimization, one can place an edge at a certain location, with the normalized intensity log slope (NILS) along this edge satisfying a specific threshold.

The major challenge associated with image optimization, however, is its comparatively high computational cost—each iteration typically involving re-evaluation of the aerial image and its derivatives with respect to the pixel states.

A second conventional approach known as off grid filter (OGF) works by selecting the states of the SLM pixels to approximate the diffraction field of the ideal mask being rasterized. In the OGF approach, this approximation is performed locally. That is, several neighboring pixels are utilized to approximate the diffraction field generated by the fragment of the mask covered by one or more of these pixels. Local approximation allows pre-computation of the states of these neighboring pixels (the grid filter coefficients corresponding to the selected filter stencil). An advantage of OGF is that it is comparatively fast, and can possibly be executed in real-time by applying a pre-computed filter to the given description of the pattern. However, some of the tradeoffs suffered to realize the advantages of OGF are as follows:

(i) Because the filter stencil necessarily involves a limited number of neighboring pixels, the match of the pupil field by the filtered pixel states will always be approximate, although the error of this approximation can be made relatively small for pixel dimensions that are small compared to the optical resolution length;

(ii) In many variations of the OGF approach, the filtered states of the pixels generally do not satisfy the constraints imposed on them by the SLM pixel design. One option is to introduce a scaling factor reducing the image intensity as much as necessary to satisfy the constraints. This option, however, introduces a light loss, which is generally not desirable.

(iii) In many variations of the OGF approach, the underlying requirement is that the modulated pixel should be well approximated by a graytone square. The graytone of such an approximating square should be real-valued and constant across the square. The first of these conditions is not valid for piston mirror pixels and the second condition is only approximated for a tilt mirror pixel.

One problem associated with conventional approaches such as OGF, is the issue of light loss. That is, given the pattern on an ideal mask to rasterizing, the conventional approaches provide a rasterization solution that reproduces a variation of the aerial image of the mask with this pattern. However, for many important patterns, the image that results from such rasterization is a scaled or dimmed image of the original pattern. For many patterns common to lithography (e.g., lines/spaces and contact holes), an image produced under the effects of light loss could contain as little as $\frac{1}{7}$ of the dose of the original image resulting from the pattern on the original mask.

A solution to the issue of light loss is based on certain assumptions about the modulation capabilities of the SLM pixels. Namely, this solution requires that the field generated by the modulated pixel across the projection optics (PO) pupil and in the image plane is well approximated by the field generated by gray toning squares of an SLM with a real-valued graytone. These assumptions hold for many modulation principles (tilting mirrors, liquid crystal display (LCD) cells etc.) as long as the pixels are sufficiently under-resolved. However, these assumptions might not immediately be valid for pistoning mirror pixels (complex-valued graytones with unit amplitudes). They are also largely invalid in the case of other modulation types (e.g. tilting mirrors) when the dimensions of the sub-resolution pixels approach the resolution limit from lower values.

What is needed, therefore, is a technique to provide accurate rasterization with minimal light loss for SLM pixels that can be applied using various modulation principles.

BRIEF SUMMARY OF THE INVENTION

Consistent with the principles of the present invention as embodied and described herein, the present invention includes a method for determining states of spatial light modulator (SLM) pixels in a lithography system configured to print a desired pattern. The method includes determining diffraction orders associated with an ideal mask of a pattern to be printed by the lithography system, and then configuring the states of the SLM pixels to match all the diffraction orders that are relevant in the image formation.

By way of background, the die pattern to be printed in OML is generated by the SLM, which serves as a contrast device. Each SLM pixel is independently actuated so as to change its optical properties. Different physical principles can be used to modulate the light. For instance, liquid crystal pixels can be used to vary the amplitude transmittance of a pixel. Mirrors actuated by tilting or pistoning can be used to vary the amount of light from each pixel reaching the image plane.

Optical rasterization is a technique that, given the description of the pattern to be printed (e.g. a graphic design system (GDS II mask file)), computes the states (e.g. pixel transmittance or pixel micro-mirror tilt or piston) of the contrast device pixels that will reproduce the pattern at an optical image plane.

The present invention provides an optical rasterization technique, referred to herein as global optimization rasterization. This technique includes matching the pupil field generated by the given mask, and taking into account the constraints dictated by the modulation principle of the contrast device.

More specifically, the global optimization technique of the present invention computes the states of the SLM pixels that result in a match with the desired diffraction pattern. This match is achieved within the portion of the pupil space that participates in the formation of the image for the given illumination mode. Under certain reasonable conditions, this match is sufficiently exact and the partially coherent image from the SLM can match the aerial image of the mask in and out of focus.

Unlike the OGF approach noted above, the global optimization technique of the present invention explicitly accounts for the constraints on the modulation capabilities of the SLM pixels. As a result, light loss can be eliminated or significantly reduced. In fact, light gain can be achieved in the case of particular patterns and pixel geometries.

Additionally, if the appropriate degrees of freedom are available on an SLM, the rasterization technique of the present invention can be useful in reproducing an ideal or near-ideal pattern that is ordinarily prohibitively expensive or even impossible to implement on a physical photomask. The present invention provides OML with a capability to enable new classes of applications that are not currently feasible with conventional mask-based lithography.

As noted above, the global optimization technique of the present invention is based on finding the states of the SLM pixels, subject to the appropriate constraints on them, and minimizing the light loss. One category of constraints are the modulation limitations imposed by SLM pixel design—e.g. maximum possible/used tilt angle of the tilting mirror pixels.

Another important constraint on the states of the pixels is that SLM pixels should match or approximate the desired distribution of the field in the extended pupil, multiplied by a scaling factor (if necessary).

The global optimization techniques provided in the present invention significantly reduce the impact of SLM pixel constraints in order to reduce or eliminate light loss in resulting OML patterns.

Further features and advantages of the present invention as well as the structure and operation of various embodiments of the present invention, are described in detail below with reference to the accompanying drawings.

BRIEF DESCRIPTION OF THE DRAWINGS/FIGURES

The accompanying drawings which are incorporated herein and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

Figure 1:
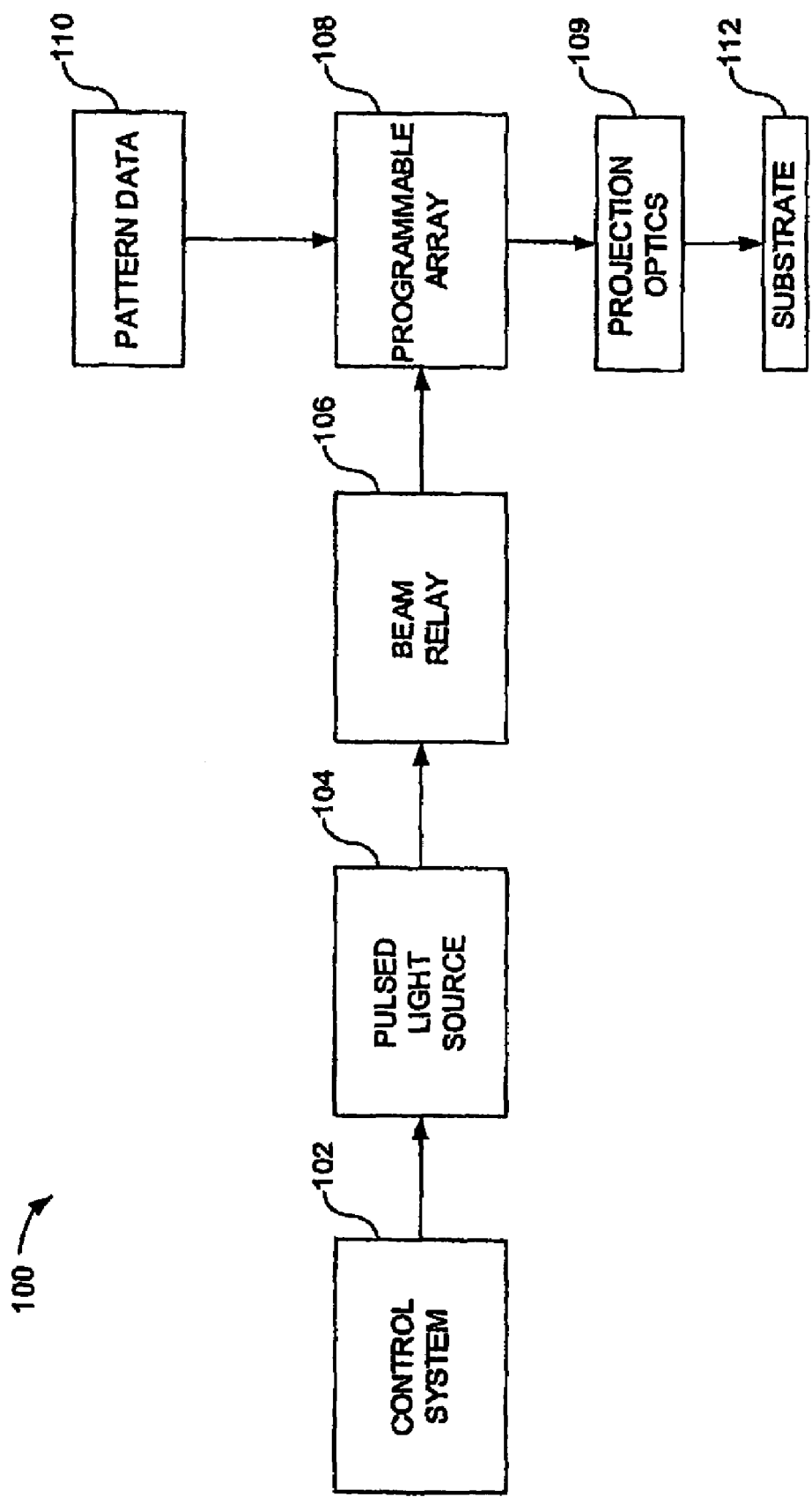
FIG. 1 is a block diagram illustration of a maskless lithography system structured and arranged in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

It would be apparent to one skilled in the art that the present invention, as described below, may be implemented in many different embodiments of hardware and/or the entities illustrated in the drawings. Thus, the operation and behavior of the present invention will be described with the understanding that modifications and variations of the embodiments are possible, given the level of detail presented herein.

By way of background, FIG. 1 is a block diagram view of a maskless lithography system arranged in accordance with an embodiment of the present invention. In FIG. 1, a maskless lithography system 100 includes a control system 102. The control system 102 includes a computer processor, a memory, and a user interface configured to enable a user to input data for instructing the maskless lithography system 100 to produce a printed pattern.

The control system 102 is coupled to a pulsed light source 104 which provides pulses of light from a light source, such as an excimer laser or some other suitable pulsed illumination mechanism. The pulsed light source 104 is coupled to a beam relay system 106 which is typically an anamorphic system that includes a series of lenses to create a desired numerical aperture in the light beam produced by the pulsed light source 104. The pulsed light output from the beam relay 106 is imaged onto a programmable array 108.

The programmable array 108 is configured to receive image pattern data 110, representative of a desirable lithographic pattern, and reflect light representative of the image to a projection optics (PO) 109. The pattern data 110 is also known in the art as mask layout data. The light reflected from programmable array 108 passes through the PO 109 and then falls onto the substrate 112. The function of the PO is (1) to form an image of the object on the substrate and (2) to reduce the image compared to the dimensions of the object. A pattern, representative of the image data 110, is then imaged onto a photosensitive surface of substrate 112, such as a wafer substrate, which is being scanned at a constant velocity. As understood by those of skill in the art, the images that are to be projected onto the photosensitive surface 112 are contained in the programmable array 108 and may be changed by a user via the control system 102.

The present invention substantially reduces or eliminates light loss, as discussed above, depending on the pattern and the illumination mode in systems, such as the lithography system 100. For pixel dimensions that are sufficiently smaller than the resolution limit, the global optimization technique of the present invention facilitates matching the pupil field variation from any ideal mask, thus reproducing the pupil field with little or no residual error.

A non-linear version of global optimization allows rasterization for the SLMs that have modulation principles that cannot be well-approximated by graytones. Global optimization also allows processing of pixels that are too large for graytone approximation to be sufficiently accurate.

Stated another way, global optimization enables computation of the states of all SLM pixels that would render the desired distribution of the field in the PO pupil. The desired field in the PO pupil can be the field from an ideal mask to be emulated by the SLM or the custom-designed pupil field resulting in the image with desired properties. Only the part of the PO pupil affecting the aerial image needs to be considered.

The area of the PO pupil actually affecting the aerial image is called the essential PO pupil. For a partially coherent (PC) illumination, this area is a support of a convolution of the extended source with the numerical aperture (NA) circle. The extended PO pupil is the smallest circular pupil containing the essential PO pupil. Matching the pupil field within the essential PO pupil (or, as a simplification, the extended PO pupil) allows one to compute the rasterization that will work for the PC illumination mode, corresponding to this extended source. This concept is addressed more fully below in reference to FIG. 4.

Global optimization, as implemented in the present invention, can use the (generally non-linear) function describing the dependence of the field across the extended pupil on the modulated state of the pixel. An alternative approach to using the non-linear function is to use a linear graytone approximation. This is valid for SLM pixels producing real-valued graytones (e.g. tilting mirrors), provided that the pixels are small (under-resolved).

When a linear graytone approximation is not valid, for example in the case of pistoning mirrors, one solution to finding the states of the pixels corresponding to the resulting graytones is to use emulation. For generic contrast devices, a particular embodiment of the present invention can be used to minimize the emulation error.

In accordance with the present invention, emulation error can be minimized in the following exemplary manner. If g is the vector of (complex) graytones, and A is the matrix that maps the complex-valued distribution of graytones into the values of the field through an essential (or extended) pupil, then obtain the pixel states p by $$\text{minimize} \|A(f(p)-g)\|^2$$

subject to the constraints determined by the modulation principle. Example: $f(p)=\exp(i\,p)$ for pistoning mirrors (p the pistoning displacement as phase).

Several variations to the exemplary technique above can be formulated. These variations can include, for example, (a) reducing the total problem to a set of local problems, by multiplying the norm by weighting functions that are nonzero for only a few pixels at the time. Another variation (b) can include changing variables in such a way as to transform the above problem into an unconstrained optimization problem. This can be done globally or locally (as in (a) above). A final variation (c) can include combining the above problem with the Global Optimization of graytones into a problem to produce optimal p rather than optimal g.

Another exemplary embodiment of the present invention can be used to minimize emulation error for pistoning mirror devices. That is, for pistoning mirror devices, a simplified expression, equivalent to minimizing $\|(f(p)-g)\|^2$, can be solved in some approximated sense. A concrete example (e.g., one dimension, the two dimensional case is similar) of this is to solve the equations in the least-squares sense, for each pair of adjacent pixels j and j+1.

$$(\tfrac{1}{2})(\exp(ip_j)+\exp(ip_{j+1}))=(\tfrac{1}{2})(g_j+g_{j+1}) \qquad (1)$$

In this example, the right hand side represents the average graytone for two adjacent mirrors, or the approximate graytone of a pixel "in between" the original two. This "shifted grid" emulation allows the use of piston mirrors of the same size as the original (graytone) ones, a considerable advantage over those techniques in which each graytone is realized using two or more piston mirrors.

Figure 2:
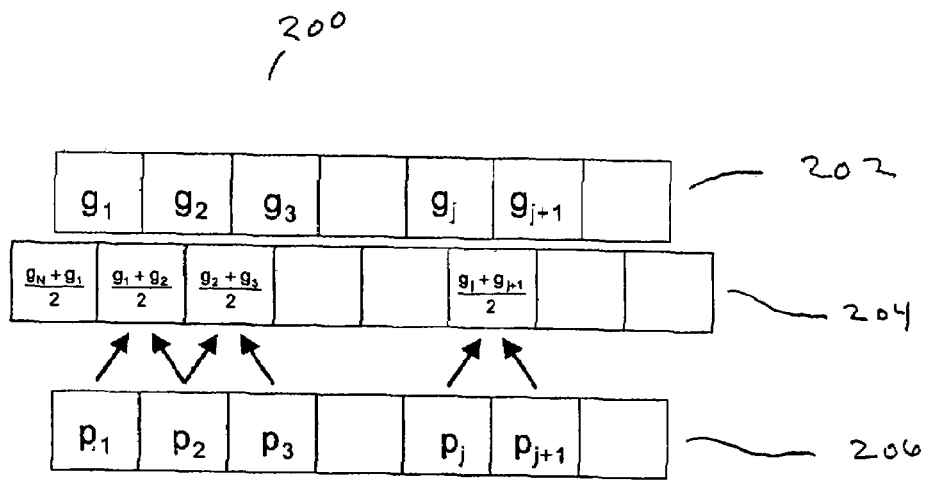
FIG. 2 is an illustration of a one dimensional mirror grid in accordance with the present invention.

FIG. 2 is an exemplary illustration of a one-dimensional variation on the emulation methodology discussed above. More specifically, FIG. 2 includes a one-dimensional shifted grid 200 including graytones 202 for a real mirror grid. Instead of averaging the graytones of adjacent pixels, graytones can be recomputed for a new virtual grid 204 that is shifted ½ pixel off from the real mirror grid. Phase angles 206 can be computed for configuring respective pistons in accordance with the new virtual grid 204 in accordance with equation (1).

Figure 3:
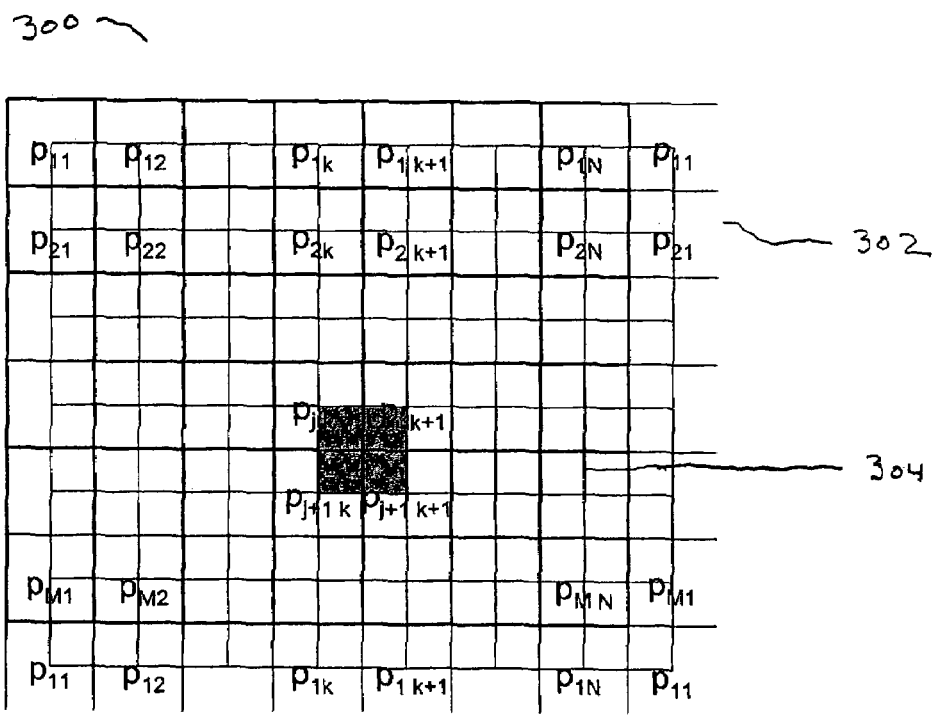
FIG. 3 is an illustration of a two dimensional mirror grid in accordance with the present invention.

FIG. 3 is an exemplary illustration of a two-dimensional variation on the emulation methodology above. That is, FIG. 3 includes a two-dimensional shifted grid 300 using four adjacent pixels. The two-dimensional shifter grid 300 includes a virtual grid 302 (shifted ½ pixel in both directions). Phase angles 304 of the pistons are extended periodically in both directions in accordance with equation (2) as follows:

$$\frac{1}{4}\left(e^{-ip_{jk}} + e^{-ip_{j+1k}} + e^{-ip_{jk+1}} e^{-ip_{j+1k+1}}\right) = \frac{1}{4}(g_{jk} + g_{j+1k} + g_{jk+1} + g_{j+1k+1}) \quad (2)$$

Also, a more accurate emulation can be obtained using three or more (in one dimension), or nine or more (in two dimensions) pixels at the time. Finally, the Global Optimization of graytones can be modified so as to obtain a set of graytones that are more amenable to be implemented accurately using the above shifted grid approximation.

The emulation methodology related to generic contrast devices and pistoning mirror devices discussed above, can provide a higher level of lithographic performance, for each type of contrast device. Although these two emulation techniques were discussed above, the present invention is in on way limited to these particular techniques. Numerous other emulation approaches are possible within the spirit and scope of the present invention.

If the exact non-linear version of the global optimization technique is used, as noted above, the modulation states of the pixels should be constrained to the limits that are utilized during the MLL tool operation (e.g. max. tilt angle of the tilting mirror pixel). If, on the other hand, the linear graytone approximation is used, the graytones should be constrained to the limits dictated by the actual modulation capabilities of the pixel.

Rasterization, as performed by the present invention, is based upon using the SLM pixels to match the diffraction pattern generated by an ideal mask, or to match a known diffraction pattern resulting in an image with desired properties. Although the present invention primarily addresses rasterization of dense (i.e. infinitely periodized) patterns, arbitrary (e.g. isolated) features can also be accommodated either by working with the continuous diffraction field patterns through the pupil, or by considering the dense patterns with sufficiently large pitch.

The programmable array 108 can include an SLM, or some other suitable micro-mirror array. By way of background, an SLM is an array composed of a multitude of individually controlled pixels (otherwise referred to as SLM elements). Each pixel can change its optical properties in a controllable manner so that the field in the object plane can be modulated. A typical SLM has square pixels arranged in a rectangular array, with each pixel having an ability to change only one of the parameters characterizing its optical properties (one-parametric local modulation) within a certain range.

For example, an existing SLM has 16×16 mm$^2$ tilting mirrors arranged in a 2040×512 array and running at a 1 KHz refresh rate. The light modulation principles implemented in different SLMs can be classified as transmittance modulation, modulation by light deflection, phase shift modulation, defocus modulation, and/or a combination of several of the aforementioned modulation types.

Figure 4:
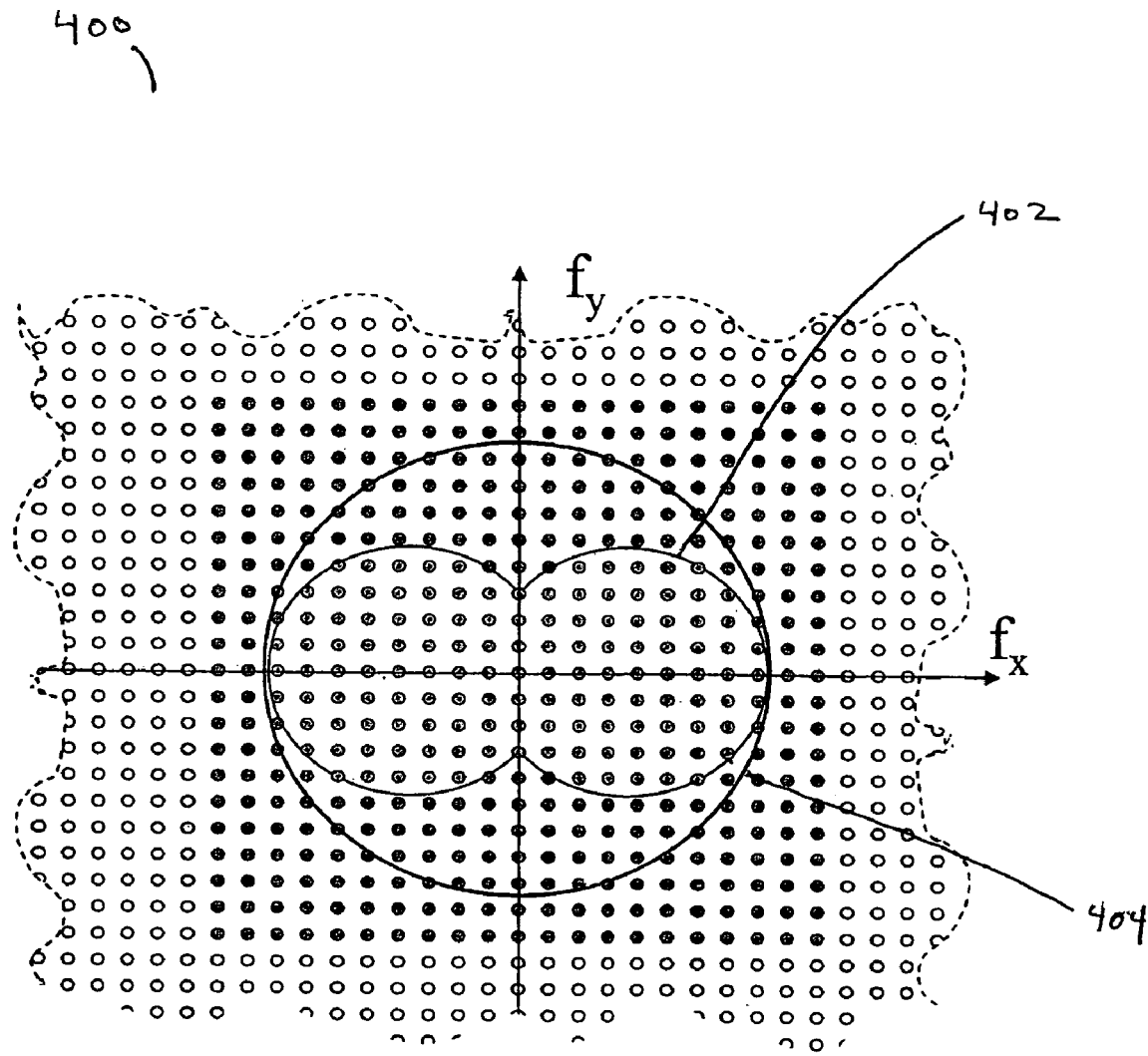
FIG. 4 is an illustration of a diffraction order pattern generated by an ideal mask in accordance with the present invention.

FIG. 4 is an illustration 400 of locations of the diffraction orders (d.o.s.) generated by a mask within the system 100. The illustration 400 is a simplification in both the shape of the pupil and the fact that it only depends on the maximum illumination sigma ($\sigma_{max}$). More specifically, given a PO with a numerical aperture NA, for the case of a coherent illumination with a wavelength $\lambda$, only the diffraction orders within a circle defined by $(f_x^2+f_y^2)<(NA/\lambda)^2$ affect the aerial image. For a more general case of partially coherent illumination, essential or extended pupil of the PO can be defined as the area in the pupil coordinates ($f_x$, $f_y$), the field from which affects the aerial image.

The essential pupil depends on the NA of the PO and the particular illumination mode (the shape of the extended source). In the most general case, in mathematical terms, the essential pupil is a support of a convolution of characteristic functions of the NA circle and the extended source in the plane of the pupil coordinates ($f_x$, $f_y$). For instance, in FIG. 4, the double circle contour 402 bounding the diffraction orders affecting the aerial image is an essential pupil corresponding to a certain dipole illumination mode with the radius of each circle being (NA/$\lambda$). More specifically, The portion of the diffraction pattern in the pupil affecting the aerial image for a given illumination mode is know as the essential pupil. It is a support of the convolution of the NA circle and the source. The example above corresponds to a dipole source.

In the example of FIG. 4, a circular portion 404 is know as the extended pupil and can be defined by $$(f_x^2+f_y^2)<[(1+\sigma_{max})(NA/\lambda)]^2, \quad (3)$$

The extended pupil does not depend on the shape of the illumination, but only on the maximum $\sigma$ The complex amplitudes $U^{(p)}$ of all diffraction orders participating in the formation of an aerial image are given by $$U^{(p)}=A(p), \quad (4)$$

where p is a vector of states of SLM pixels (e.g. tilts of tilting mirrors, pistons of pistoning mirrors, etc.), and A(p) is a predefined function that depends on the pixel modulation principle, pixel dimension/geometry, the wavelength of the light, illumination mode, and NA of the PO.

For the case of SLMs of certain modulation principles, the pixel is an object with a uniform (generally complex-valued) transmittance/reflectivity (a pixel graytone). Examples include the LCD pixels changing their amplitude transmittance or pistoning mirror pixels varying the phase of their complex-valued reflectivity. For some other modulation principles used in SLM pixels, the diffraction field from a single pixel can be well approximated by a field from an object that has dimensions of the actual pixel and a uniform complex-valued transmittance/reflectivity. For example, tilting mirror SLM pixels are characterized by the quantity referred to as complex amplitude to define an effective graytone. For those cases where graytone approximation is applicable, the accuracy of this approximation increases as the dimension of the pixel decreases compared to $\lambda/NA$.

For purposes of illustration, consider a periodized ideal mask pattern with a period sampling an integer number of SLM pixels. Such patterns result in co-located d.o.s from the ideal mask and the graytoning squares of an SLM. The complex amplitudes $U^{(p)}$ of all d.o.s participating in the formation of an aerial image is given by:

$$U^{(p)}=Ag, \qquad (5)$$

where g is a vector composed of graytones corresponding to all SLM pixels. In the framework of the graytone approximation above, the complex amplitudes of the diffraction orders inside the essential pupil are a linear function of the pixel graytones (g). A is a known matrix that depends on the pixel dimension and geometry, the wavelength of the light, illumination mode and NA of the PO, and the graytone of each pixel can be expressed as a function of its state parameter: $g_j = g_j(p_j)$. A is composed of the rows of the discrete fourier transform (DFT) matrix, corresponding to d.o.s affecting the image, with each column multiplied by $sinc(Lf_x) sinc(Lf_y)$, where L is the dimension of the pixel.

Given the description of a mask pattern, e.g. a union of polygons each with its own amplitude and phase transmittance on a background of a known amplitude and phase transmittance, one can compute the complex amplitudes R of the diffraction orders inside the essential pupil. To solve the rasterization problem, one needs to satisfy a set of generally non-linear equations:

$$A(p)=R. \qquad (6)$$

The SLM rasterization methods based on finding the pixel states satisfying the equation (5) is called global optimization.

Using the global optimization technique, initial assumptions include the description of an ideal mask as a union of polygons, each with its own amplitude and phase transmittance on a background of a known amplitude and phase transmittance. From this description, one computes the complex amplitudes (R) of the ideal mask d.o.s. affecting the aerial image:

$$Ag=R \qquad (7)$$

Expression (7) is then solved to determine the graytones.

Additional factors to consider include the number of equations vs. the number of unknowns, constraints on g, the light loss problem, and computational complexity.

One other issue arising in rasterization is the ratio of the number of conditions (6) to be satisfied to the number of available degrees of freedom (i.e. the number of available pixels). If the number of available degrees of freedom exceeds the number of conditions (6), the diffraction field distribution across the essential pupil can be reproduced and the SLM partially coherent aerial image will match that of a mask, in and out of focus. Under these conditions, for the pixels with modulation principles allowing sufficiently accurate graytone approximation, the matrix A can be demonstrated to be a full-rank matrix. In general, an infinite number of distributions between the pixels can be found, resulting in the aerial image matching that of a given mask, both in and out of focus.

Expression (7) is solved with the assumption that the graytones are real. Based on this assumption, the number of unknowns ($N_u$) is the number of pixels in a simulation region: $N_u = N_x N_y$.

The number of equations ($N_e$) is equal to 2 times the number of d.o.s affecting the aerial image—because of Re and Im. For estimation purposes, assume that essential pupil is a circle of the radius $NA(1+\sigma_{max})/\lambda$ ($\sigma_{max}$ is max illumination sigma) and that the simulation domain has dimensions $D_x$-by-$D_y$ to get $$N_e = 2\pi(NA(1+\sigma_{max})/\lambda)^2/(1/(D_x D_y))^2 \qquad (8)$$

$$N_e/N_u = (L/(\lambda/NA))^2 2\pi(1+\sigma_{max})^2 \qquad (9)$$

In expression (9), L is the dimension of the square pixel at the image plane (i.e. after optical demagnification). The term $\sigma_{max}$ is a non-dimensional parameter such that the area of the essential pupil in the pupil coordinates is equal to the area of the circle of the radius $NA(1+\sigma_{max})/\lambda$.

For example, $\sigma_{max}$ is maximal illumination sigma for the annular illumination mode. The system remains underdetermined ($N_e < N_u$) so long as an SLM pixel is sufficiently under-resolved by the PO. As the size of the pixel is increased towards the optical resolution limit of the PO, the number of available degrees of freedoms $N_u$ drops to the point where the system is over-constrained ($N_e > N_u$) and an exact solution cannot be determined.

The system is underdetermined ($N_e < N_u$) as long as an SLM pixel is sufficiently under-resolved by the PO. It should be noted that if the SLM pixels are sufficiently sub-resolution, then the SLM has sufficient number of degrees of freedom to reproduce the desired distribution of field in the pupil.

The states of individual SLM pixels $p_j$ are usually subject to certain constrains, dictated by the design and utilization of the SLM. For instance, the tilt of the tilting mirror pixels varies within certain ranges. These constraints should be taken into account when looking for the pixel states satisfying (9).

When a graytone approximation is utilized, and the graytones utilized in the approximation can be assumed to be real-valued, these constraints usually reduce to inequality constraints:

$$g_- \leq g_j \leq g_+ \qquad (10)$$

As an example, in a particular case of a tilting square mirror pixel, the graytone is given by $g=sinc(\alpha/\alpha_0)$, where $\alpha$ is the tilting angle, therefore the constraints are $g_+=1$ and $g_-=min\{sinc(x), 0 \leq x \leq 2\}=-0.2172$. The approximation for $g_-$ degrades as the feature moves towards the edge of the PO pupil.

In another embodiment of the present invention, a tilting square mirror with a ¼ wavelength phase step, whose graytone is given by $g=sin(\pi\alpha/2\alpha_0) sinc(\alpha/2\alpha_0)$, therefore the constraints are $g_-=-0.722$ and $g_=$=0.722.

Using the graytone approximation for tilting mirrors causes a graytone approximation error. Studies have shown this error to be small in many cases of interest. In the case that the graytone approximation error need to be reduced, one can do so by including in the pupil matching not just the value of the field at the center of the pupil, but also its slope (in the tilting direction). This approach doubles the number of equations, but the systems of equations is still underdetermined for sufficiently under-resolved pixels.

In the case of another example, assume a requirement to rasterize the single shot of an SLM with $4*10^6$ pixels for the case of interest (L=8 um, 1=193 nm, NA=0.93/267, $\sigma_{max} \sim 1$). Using (i) the equality constraints A g=R and (ii) the unknowns vs. the number of equations expression above, one gets $N_e/N_u \sim 0.52$, i.e. $N_e \sim 2*10^6$ and $N_u = 4*10^6$.

A can be expressed in terms of the DFT of the graytone array g. This makes it possible to use a fast Fourier transform (FFT), or other similar techniques, to evaluate the matrix product A g. This evaluation can be performed, for example, with the typical available random access memory (RAM) and central processing unit (CPU) included within conventional personal computers (PCs). For example, computing a FFT of a 4 mega pixel array of graytones takes several seconds on 500 mega hertz (MHz) pentium III PC with 256 mega bytes (MB) of RAM memory.

Generally, global optimization techniques require simultaneous optimization of all the graytones describing a periodic pattern. Since normally the die pattern is not periodic, containing different regions with different features, as well as OPC and RET assist features, one could be forced to perform the optimization over the whole die, large pieces of a die, or at least all the pixels on a single contrast device (already in the millions). Solving optimization problems with millions of variables are not feasible. A need exists, therefore, to reduce the larger optimization problems to a set of smaller optimization problems (with the number of variables in the thousands, not millions). This is solved by the current invention.

Figure 5:
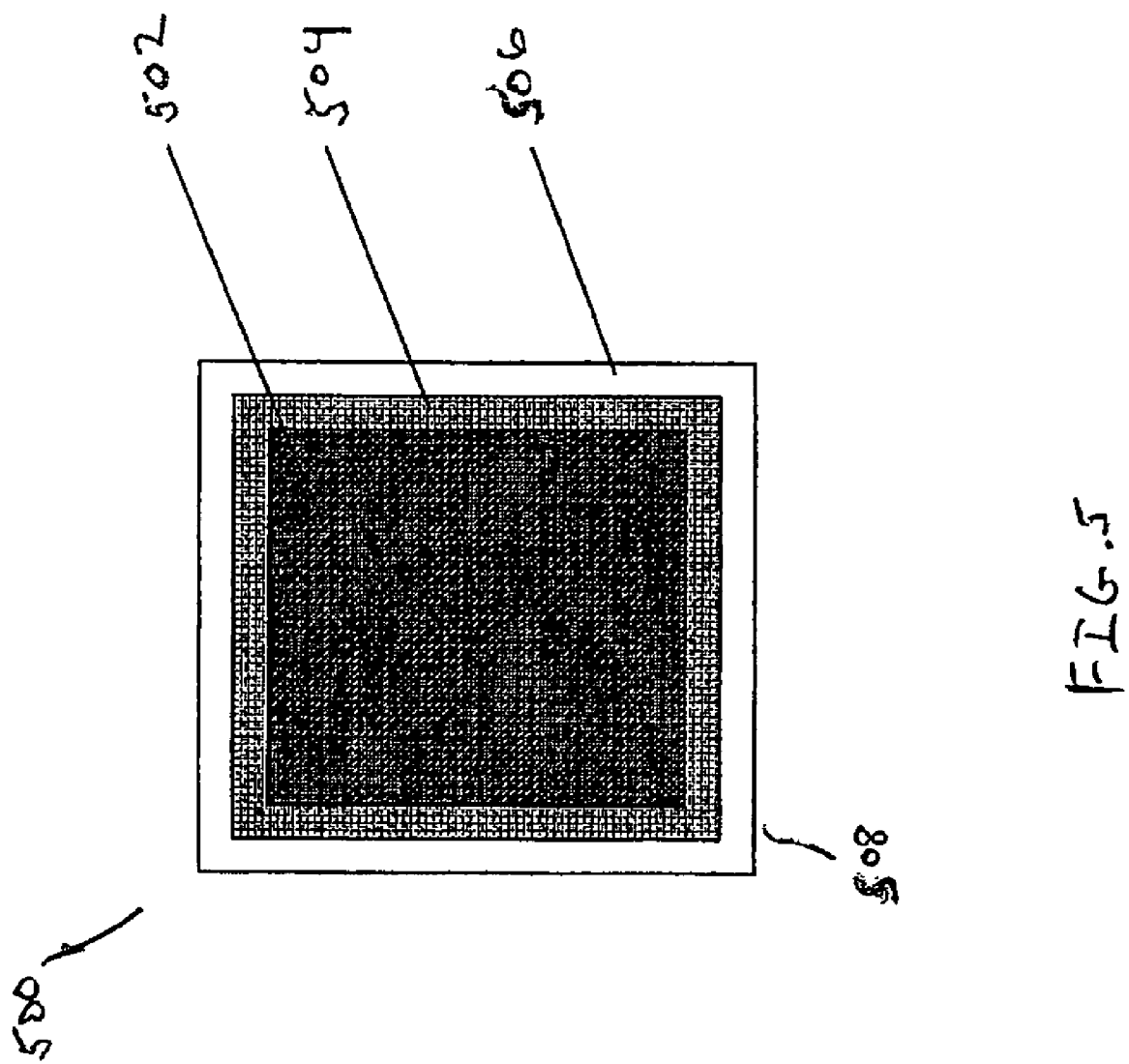
FIG. 5 is an illustration of reducing larger optimization problems to smaller problems in accordance with the present invention.

FIG. 5 is an illustration of yet another embodiment of the present invention for reducing the larger set of optimization problems to smaller ones. In FIG. 5, a pattern 500 can be divided into reasonably sized patches 502, for example 500×500 pixels. Each patch 502 gets extended an additional number of pixels 504 and then transitioned to zero (or ½) graytone 506 so as to not to interfere with the central patch. Such an extended patch can now be periodized 508, and the rasterization problem solved via an optimization of manageable size. The solution, illustrated in FIG. 5, would be valid (with a great degree of accuracy) on the pixels on the original patch. The exemplary techniques of FIG. 5 enables the global optimization techniques to provide the best rasterization solution, one that is feasible and easier to implement Many windowing techniques, from 2D Fourier analysis, image processing, etc., can provide alternatives to the approach of FIG. 5. These alternatives, however, create the need for the framing approach of FIG. 5 to be applied to photolithography.

The field in the diffraction orders within the essential pupil R is a Fourier transformation of the transmittance function of the object $O(x,y)$. Partition the object into fragments $O_j(x,y)$, so that $O(x,y)=\Sigma_j O_j(x,y)$ and each fragment represents the transmittance function of an object covered by a single SLM pixel. For square SLM pixels, $O_j(x,y)$ will represent a fragment of the mask inside this square. Corresponding to this partition of the object, the pupil field R can also be presented as a sum $R=\Sigma_j R_j$, where each term $R_j$ is a Fourier transformation of respective fragment of the object $O_j(x,y)$. One of many efficient, generic triangularization techniques, well known to those of skill in the art, can be used to find the individual object components $O_j(x,y)$.

One can find particular solutions $g^{(j)}$ for each object fragment described above, satisfying the equation:

$$Ag^{(j)}=R_j \quad (11)$$

The solution is then computed as a sum of particular solutions: $g=\Sigma_j g^{(j)}$. In practice, one can solve approximately a truncated version of the problem (11) involving only several pixels adjacent to the j-th pixel. Such solutions of the truncated problems can be pre-computed and stored as parameterized grid filter coefficients. The rasterization can then be computed relatively fast by applying the pre-computed grid filter coefficients.

For sufficiently small pixels, most of the pixels sampling the edge of the feature will sample a straight-line segment of a single edge. This straight-line segment is characterized by two parameters—its position within a pixel and its slope. In order to pre-compute the grid filter coefficients, one has to consider a sufficiently large numbers of combinations of slope and positions of the edge.

Figure 6:
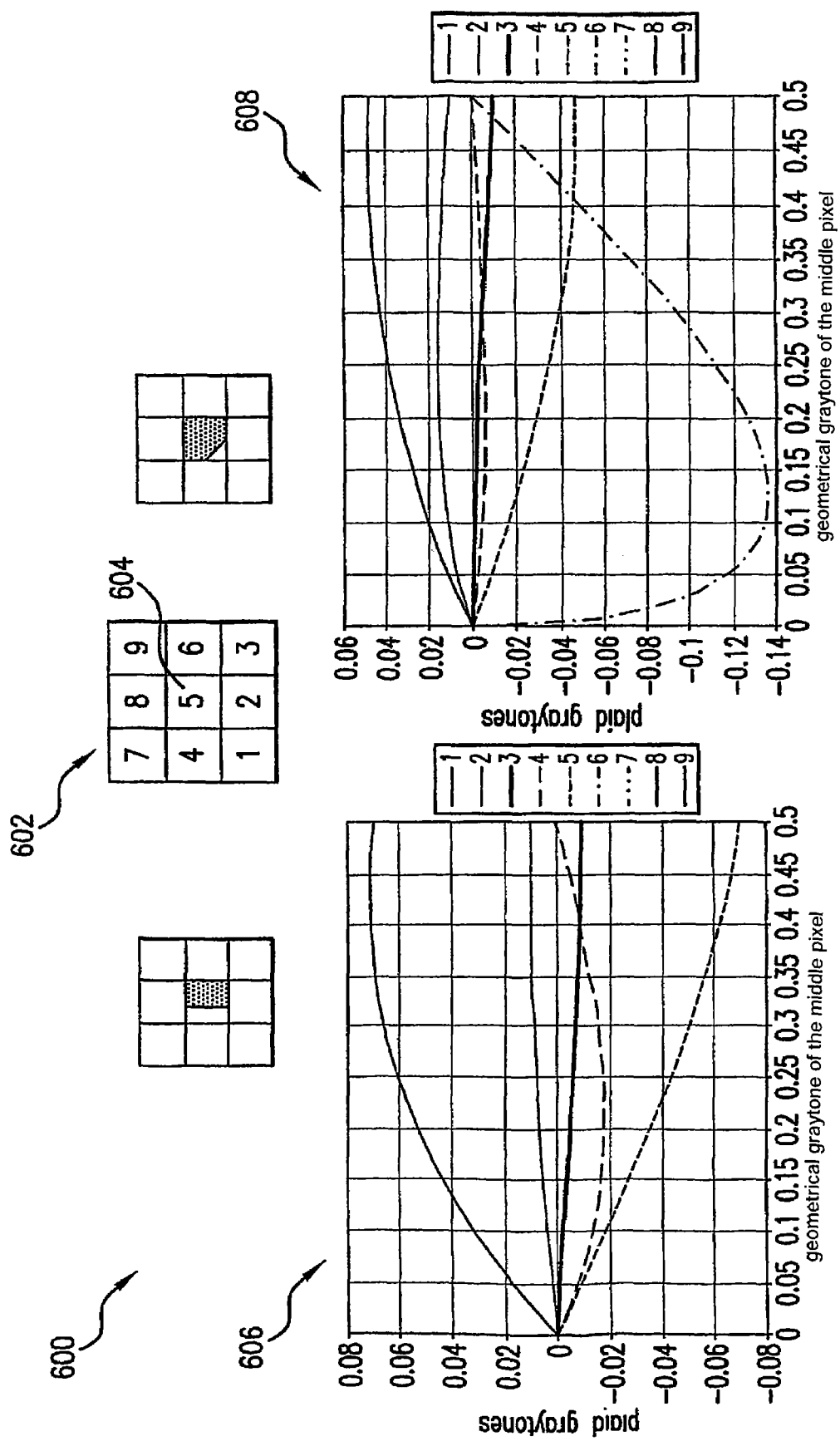
FIG. 6 is an illustration of the dependence of grid filter coefficients on both position and orientation of an edge.

FIG. 6 is an illustration 600 of the dependence of grid filter coefficients on both position and orientation of an edge of pixel 604, demonstrating that both position and slope influence the values of the grid filter coefficients. FIG. 6 illustrates the grid filter coefficients for nine pixels 602 as a function of a clear area of the middle pixel 604. A graph 606 provides an illustration of the vertical edge of the pixel 604. A graph 608 provides an illustration of a 45° edge of the pixel 604.

One important consequence of using the pre-computed filter coefficients of FIG. 6 is that the components of the resulting solution (g) do not necessarily satisfy the constraints (10). Accordingly, the solution is optionally scaled by a certain factor to be brought into the range dictated by (10). The need to scale the solution results in that the resulting rasterization reproduces the dimmed aerial image—the phenomenon known as light loss, noted above. For some test patterns and mirror geometry combinations, the light resulting in SLM rasterized images contained just 13% of the dose of the original mask.

Constraints on graytones (g) are determined by the modulation capabilities of the given SLMs. For the existing SLMs, these constraints are represented by the expression $$g_- \leq g \leq g_+ \quad (12)$$

As discussed above, if the pixels are sufficiently sub-resolved, the system of equations (6) has more unknowns than equations and therefore it may admit multiple solutions. In practice, however, the pixel modulation constraints discussed above may result in no solution satisfying all constraints for the given right-hand side R. One may, however, try to find the solution for the scaled right-hand side $\gamma R$, $0<\gamma<1$. If such solution exists, it will result in an aerial image, identical to that of the original mask, in and out of focus, but scaled by the factor $\gamma^2$. One example is the light loss phenomenon discussed previously with regard to the conventional OGF approach.

Significant light loss results in reduction of the dose reaching the exposure area, thus requiring higher incident dose on the object and/or an increase in exposure time and thus decreased system throughput. It is therefore desirable to utilize the multiplicity of the solutions to the rasterization problem with sub-resolution pixels in order to select a solution that results in the least light loss, and possibly even a light gain, compared to the original photomask.

To achieve this, one can solve an exemplary optimization expression with respect to the unknowns (p, γ):

maximize γ
subject to (i) $A(p)=\gamma R$,
   (ii) pixel modulation constraints on (p), as discussed above,
   (iii) γ>0.

Light loss can be minimized by, for example, finding the real graytones (g), in the following exemplary expression such that $$Ag=R$$

$$g_- \leq g \leq g_+$$

Even though the above system of linear equations is underdetermined, the modulation constraints on g may result in that a solution does not exist for certain common patterns (right-hand sides R).

The solution can nevertheless be found for an attenuated pattern:

$$Ag=\gamma R \quad (13)$$

$$g_- \leq g \leq g_+ \quad (14)$$

where $0<\gamma<1$ is an attenuation constant.

To expose such an attenuated pattern, one needs to increase the dose proportionally to $(1/\gamma)^2$—a light loss problem. For example, for some conventional rasterization techniques, it has been observed that doses need to be increased by a factor of up to 6-8. The rasterization technique of the present invention minimizes light losses of this order.

The above is a linear programming problem and many efficient algorithms exist for its solution. This approach can be used with SLMs of any modulation principles—as long as there is a reasonably accurate way to relate the state of each pixel with some effective graytones (g). SLMs having different modulation principles include SLMs with tilting mirror pixels and tilting mirror pixels with steps. Pistoning mirrors are less obvious, but also can be done too via a shifted grid or similar pistoning mirror mimicking approaches.

For the case of pistoning, a non-linear approach can be used. Global optimization using nonlinear piston optimization entails finding the real-valued pistons of pixel mirrors p such that $$A\exp(ip)=R \quad (15)$$

Here, exp(i p) is a result of component-wise exponentiation.

Note that there is no need to impose constraints on p, as long as a full piston modulation range ([0, 2π]) is available for all pixels. Pistons outside this range are exactly equivalent to their values mod 2π.

The above system of expressions (15) is desirably solved iteratively, starting from an initial estimation. During actual laboratory implementations using the considered cases, the iterations converged relatively fast (~5 iterations) starting from a reasonable initial guess (pistons estimated from geometrical graytones). The advantage of this method is that it provides avoidance of graytone mimicking errors.

Reduction of a constrained optimization problem to an unconstrained one:

Given a g that must satisfy the constraints $g_-<g<g_+$, define $g=\frac{1}{2}(g_++g_-)+\frac{1}{2}(g_+-g_-)\cos(p)=c+d\cos(p)$ $Ag=R$ becomes $A(c+d\cos(p))=R$, and then $A\cos(p)=(1/d)(R-Ac)=R_{mod}$, for which an unconstrained optimization method can be used.

Examples of light loss minimization techniques are provided below.

A first of these examples is based on patterns of lines and spaces. The parameters includes pitch [135; 150; 195; 260; 715]* nanometers (nm)/M and linewidth [65; 68.68; 80.77; 104.65; 107.20]*nm/M. The lines and spaces patterns are shifted by 0:1:14 nm (wafer scale). The associated imaging parameters are:

λ=193.375*nm; (wavelength)
M=30/8000; (magnification)
NA=0.93*M; (object-side numerical aperture)
Illumination: $\sigma_{max}$=0.89 (e.g. C-quasar 0.69<σ<0.89, 30 deg b.a.)

SLM pixels: pistoning or tilting mirrors, L_x=8 micrometer (um) [30 nanometer (nm) wafer scale]. In this example, the global optimization technique of the present invention is used to minimize the light loss in emulating the 6% Att phase shifting mask (PSM).

Figure 7:
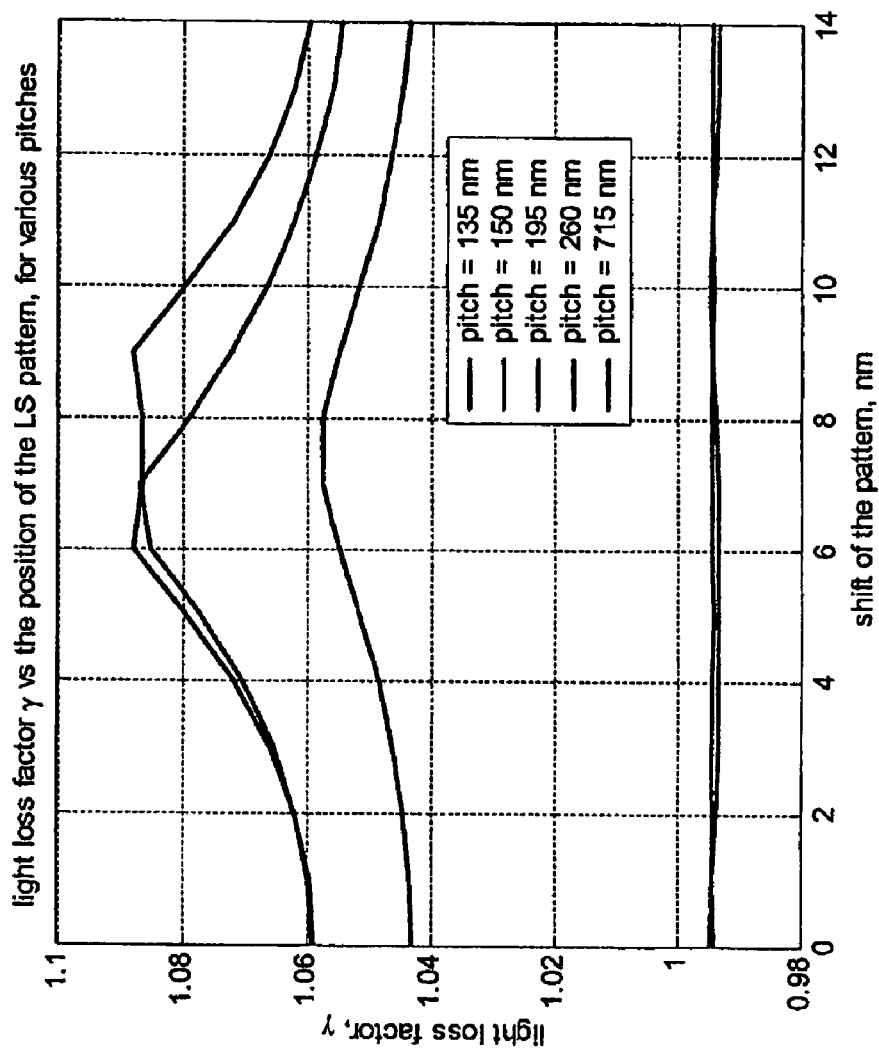
FIG. 7 is a graphical illustration of minimizing light loss vs. pitch and position of pistoning mirrors in accordance with an aspect of the present invention.

FIG. 7 is a graphical illustration 700 of minimizing light loss vs. pitch and position of pistoning mirrors, in support of the first example. As shown in FIG. 7, the minimization light loss factor, created through use of the present invention, varies minimally (compared to the light loss factor resulting from conventional techniques discussed above) as a function of the position of the pattern. In FIG. 7, with pistoning mirrors, there is an overall light gain (not loss), unless the pitch is greater than ~200 nm.

As noted above, FFT decomposition is one other technique that can be used to enhance the performance of global optimization rasterization. For example, in equation (7), A can be expressed in terms of a matrix F (a discrete FT of the pixel graytones) and a rectangular matrix K composed of selected rows of a diagonal matrix (A_matrix):

$$A=KF \quad (16)$$

One advantage of the approach of equation (16) is that an FFT can be used to compute Ag in O(N ln(N)) time without storing the A_matrix. Another advantage is that the minimal norm solution of equation (7) can also be computed using FFT in O(N ln(N)) time without storing the matrix A:

$$g\_min\_norm=F^T K^T (KK^T)^{-1}R$$

The above FFT-based techniques to compute A g and g_min_norm serve as building blocks for iterative methods used to account for (i) non-linearity in modulation, (ii) constraints on the modulation parameters, and (iii) light loss minimization.

The minimun norm (unconstrained) rasterization method can be re-expressed using the A_matrix to obtain (g) so as to escape A_matrix limits on execution storage and speed. For example, for Aerial Image Testing (AIT) in short term, an FFT graytone rasterization method can be used for large SLM arrays (256×256 and up) that is relatively fast (0.3 sec) and minimizes memory use. Additionally, unrestrained piston iterations can be re-expressed by using the A_matrix to achieve similar results for pistons (p). Based on the piston rasterization result, an FFT script can be used for constrained graytone iteration rasterization without explicit use of the A_matrix.

Generally, the global optimization techniques of the present invention allow compensating for known gaps between pixel mirrors and known SLM pixel imperfections. The examples of imperfections are reflecting surface curvature, variation of the reflectivity across the pixel mirror, light reflected from portions of the SLM other than the pixel mirror (gaps, posts etc.).

Because the described global optimization technique of the present invention matches the field in the pupil, it can be used to compensate for the known PO aberrations. For example, for the case of coherent light and field independent aberrations, suppose the PO has a wave front aberration $W(f_x,f_y)$ and the purpose of the rasterization algorithm is to match the field in the pupil $U(f_x,f_y)$. If Global Optimization algorithm is given the pupil field to match that is equal to $U(f_x,f_y)*\exp(-i*W(f_x,f_y))$, then the resulting rasterization will compensate this PO aberrations.

The present invention can be used to compensate for defective pixels. For example, if a small number of defective pixels is present, the remaining (working) pixels will still be adequate to match the desired pupil field. The result is a compensation of defective pixels. Defective pixels generally do not affect CD, even if the defective pixel falls on the edge of the pattern.

Figure 8:
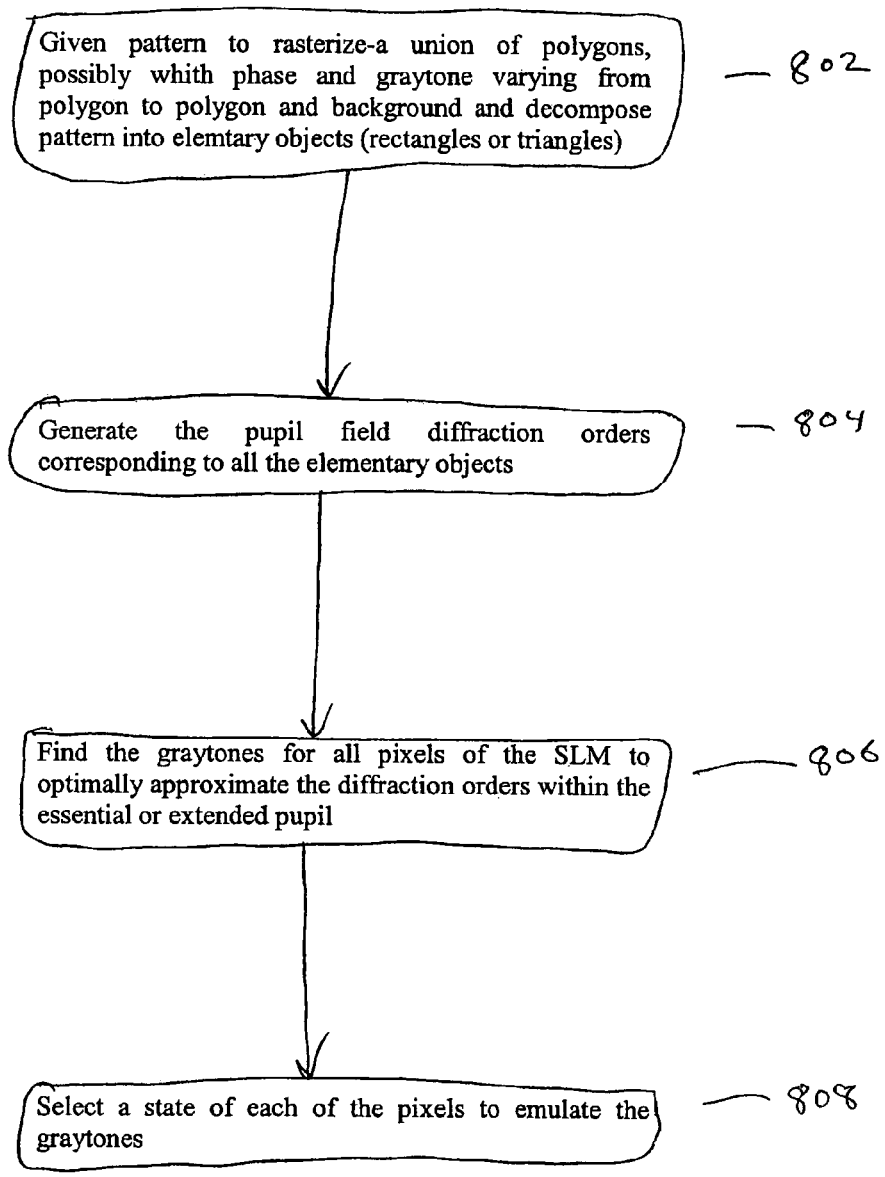
FIG. 8 is a flow diagram of an exemplary method of an embodiment of the present invention.

FIG. 8 is a flow diagram of an exemplary method 800 of an embodiment of the present invention. In FIG. 8, an original mask pattern requiring rasterization and decomposition is provided in step 802. This pattern can be provided, for example, to a wafer writer within the control system 102 of FIG. 1. These patterns typically comprise a union of polygons, possibly with phase and graytone varying from polygon to polygon and background. The pattern is be rasterized and decomposed into elementary objects (e.g., rectangles or triangles). Next, in step 804, the pupil field diffraction orders corresponding to all the elementary objects are generated. The graytones for all pixels of the SLM are located to optimally approximate the diffraction orders within the essential or extended pupil in step 806. This can be achieved by operation of well known complex-value techniques. In step 808, the state of each pixel (e.g. the tilt of its mirror, or a voltage) is selected so as to emulate or mimic the graytone assigned to this pixel.

As stated above, the present invention can be implemented in hardware, or as a combination of software and hardware. Consequently, the invention may be implemented in the environment of a computer system or other processing system. For example, the control system 102, or portions thereof, can be implemented in a computer system. An example of such a computer system 900 is shown in FIG. 9.

Figure 9:
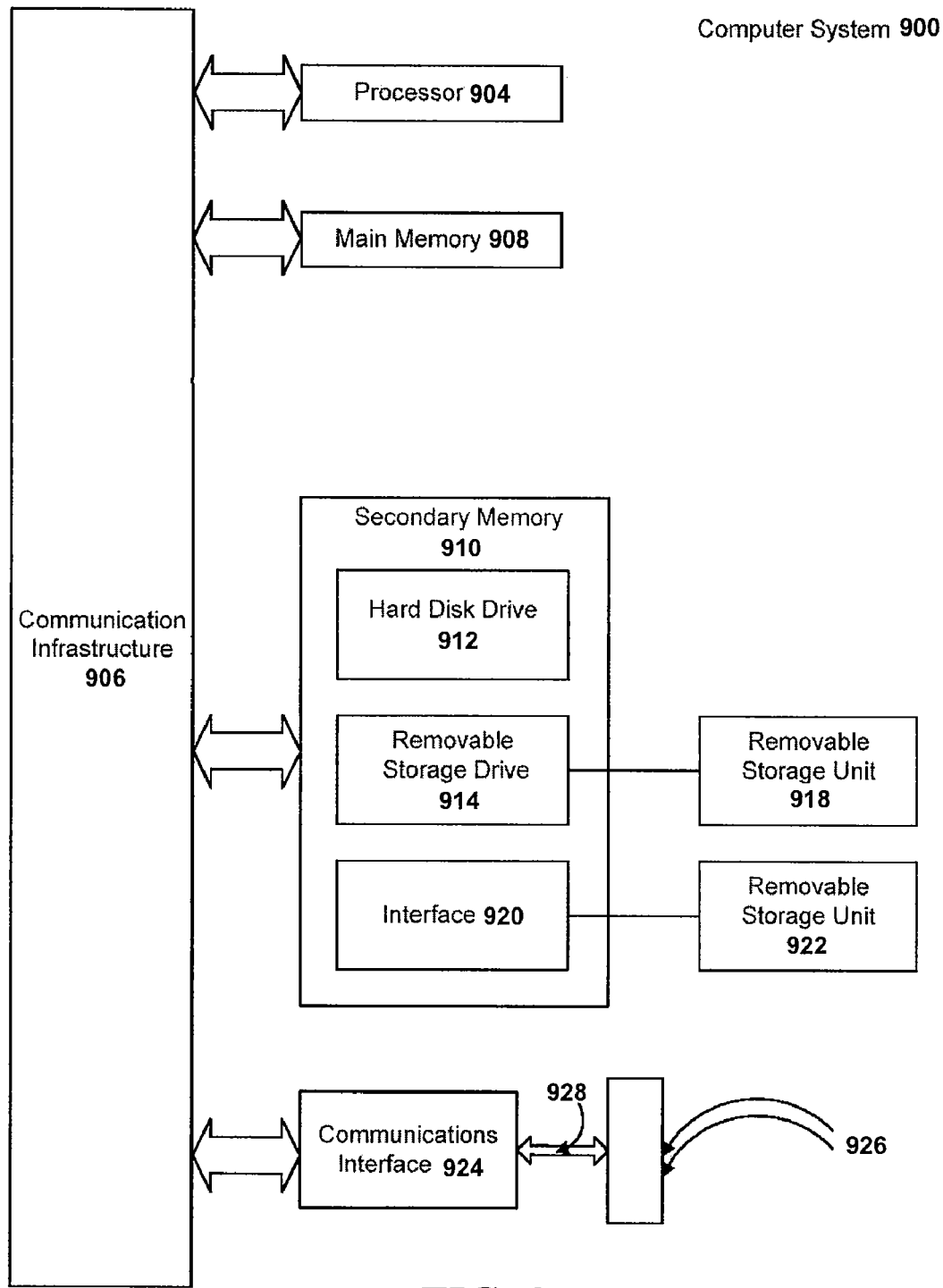
FIG. 9 is a block diagram of an exemplary computer system on which portions of the present invention can be practiced.

In FIG. 9, the computer system 900 includes one or more processors, such as a processor 904. The processor 904 can be a special purpose or a general purpose digital signal processor. The processor 904 is connected to a communication infrastructure 906 (for example, a bus or network). Various software implementations are described in terms of this exemplary computer system. After reading this description, it will become apparent to a person skilled in the relevant art how to implement the invention using other computer systems and/or computer architectures.

The computer system 900 also includes a main memory 908, preferably RAM, and may also include a secondary memory 910. The secondary memory 910 may include, for example, a hard disk drive 912 and/or a removable storage drive 914, representing a floppy disk drive, a magnetic tape drive, an optical disk drive, etc. The removable storage drive 914 reads from and/or writes to a removable storage unit 918 in a well known manner. The removable storage unit 918, represents a floppy disk, magnetic tape, optical disk, etc. which is read by and written to by removable storage drive 914. As will be appreciated, the removable storage unit 918 includes a computer usable storage medium having stored therein computer software and/or data.

In alternative implementations, the secondary memory 910 may include other similar means for allowing computer programs or other instructions to be loaded into the computer system 900. Such means may include, for example, a removable storage unit 922 and an interface 920. Examples of such means may include a program cartridge and cartridge interface (such as that found in video game devices), a removable memory chip (such as an EPROM, or PROM) and associated socket, and the other removable storage units 922 and the interfaces 920 which allow software and data to be transferred from the removable storage unit 922 to the computer system 900.

The computer system 900 may also include a communications interface 924. The communications interface 924 allows software and data to be transferred between the computer system 900 and external devices. Examples of the communications interface 924 may include a modem, a network interface (such as an Ethernet card), a communications port, a PCMCIA slot and card, etc. Software and data transferred via the communications interface 924 are in the form of signals 928 which may be electronic, electromagnetic, optical or other signals capable of being received by the communications interface 924. These signals 928 are provided to the communications interface 924 via a communications path 926. The communications path 926 carries the signals 928 and may be implemented using wire or cable, fiber optics, a phone line, a cellular phone link, an RF link and other communications channels.

In the present application, the terms "computer readable medium" and "computer usable medium" are used to generally refer to media such as the removable storage drive 914, a hard disk installed in the hard disk drive 912, and the signals 928. These computer program products are means for providing software to the computer system 900.

Computer programs (also called computer control logic) are stored in the main memory 908 and/or the secondary memory 910. Computer programs may also be received via the communications interface 924. Such computer programs, when executed, enable the computer system 900 to implement the present invention as discussed herein.

In particular, the computer programs, when executed, enable the processor 904 to implement the processes of the present invention. Accordingly, such computer programs represent controllers of the computer system 900. By way of example, in the embodiments of the invention, the processes/methods performed by signal processing blocks of encoders and/or decoders can be performed by computer control logic. Where the invention is implemented using software, the software may be stored in a computer program product and loaded into the computer system 900 using the removable storage drive 914, the hard drive 912 or the communications interface 924.

CONCLUSION

The present invention provides a unique optical rasterization approach that matches the pupil field generated by the given mask. The approach takes into account the constraints dictated by the modulation principle of the contrast device. Thus, by using the present invention, more accurate rasterization can be performed with minimized light loss for SLM pixels.

For any feasible combination of SLM type and Optimization Method, the present invention includes a version using the matrix A, discussed above, and one using an FFT. The latter is either applied directly (for linear methods), or indirectly (in each iteration of a nonlinear method).

The present invention also concentrates on the issues of computational performance of the global optimization techniques and provides an efficient method to perform rasterization on a very large scale (millions of mirrors at a time). For example, many of the specific global optimization techniques in the present significantly improve both computational time and memory requirements, ultimately reducing costs.

Other aspects of the present invention, such as the emulation methodology presented herein, can be combined with the global optimization methods to obtain graytones. These combined techniques can provide a higher level of lithographic performance for many different types of contrast devices.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

The Detailed Description section should primarily be used to interpret the claims. The Summary and Abstract sections may set forth one or more, but not all exemplary embodiments of the present invention as contemplated by the inventor(s), and thus, are not intended to limit the claims.

What is claimed is:

1. A method for determining states of spatial light modulator (SLM) pixels in a lithography system configured to print a desired pattern, comprising:
    determining diffraction orders associated with an ideal mask of a pattern to be printed by the lithography system; and
    configuring the states of the SLM pixels to match determined diffraction orders related to the desired pattern.

2. The method of claim 1, wherein the diffraction orders are representative of characteristics associated with the SLM pixels.

3. The method of claim 1, wherein the pixel states are configured to substantially match the desired diffraction pattern.

4. The method of claim 3, wherein the match occurs within an extended projection optics (PO) of the lithography system.

5. The method of claim 4, wherein the determining includes a non-linear expression describing a pupil field within the PO.

6. The method of claim 4, wherein the determining includes linear graytone approximation.

7. The method of claim 6, wherein graytone approximation is a function of pixel state parameters.

8. The method of claim 1, wherein the configuring compensates for constraints associated with modulation characteristics of the SLM.

9. The method of claim 1, wherein the diffraction orders are a function of PO numerical aperture, coordinates of the extended pupil, and an illumination wavelength.

10. A method for performing optical rasterization of spatial light modulator (SLM) pixels in a lithography system as a function of a pupil of an ideal mask to rasterize and decompose a desired pattern, the method comprising:
    generating pupil field diffraction orders corresponding to elementary objects associated with the desired pattern,
    determining graytones for all of the SLM pixels to optimally approximate the generated diffraction orders within an essential pupil of the lithography system; and
    selecting a state of each pixel to emulate a corresponding graytone assigned the pixel.

11. The method of claim 10, wherein the selecting includes (i) determining a complex valued distribution of the graytones and (ii) determining graytone matrix values to map the complex valued distribution of the graytones into the pupil field through the essential pupil.

12. The method of claim 10, wherein the elementary objects includes a union of polygons.

13. The method of claim 10, wherein the determining includes operation of complex-value techniques.

14. The method of claim 10, wherein the state include at least one from the group including tilt angle and voltage level.

15. An apparatus for determining states of spatial light modulator (SLM) pixels in a lithography system configured to print a desired pattern, comprising:
    means for determining diffraction orders associated with an ideal mask of a pattern to be printed by the lithography system and
    means for configuring the states of the SLM pixels to match determined diffraction orders related to the desired pattern.

16. The apparatus of claim 15, wherein the diffraction orders are representative of characteristics associated with the SLM pixels.

17. The apparatus of claim 15, wherein the pixel states are configured to substantially match the desired diffraction pattern.

18. The apparatus of claim 17, wherein the match occurs within an extended projection optics (PO) of the lithography system.

19. The apparatus of claim 18, wherein the determining includes a non-linear expression describing a pupil field within the PO.

20. The apparatus of claim 18, wherein the determining includes linear graytone approximation.

21. An apparatus for performing optical rasterization of spatial light modulator (SLM) pixels in a lithography system as a function of a pupil of an ideal mask to rasterize and decompose a desired pattern, the apparatus comprising:
    means for generating pupil field diffraction orders corresponding to elementary objects associated with the desired pattern,
    means for determining graytones for all of the SLM pixels to optimally approximate the generated diffraction orders within an essential pupil of the lithography system; and
    means for selecting a state of each pixel to emulate a corresponding graytone assigned the pixel.

22. A computer readable storage medium carrying one or more sequences of one or more instructions for execution by one or more processors to perform a method for determining states of spatial light modulator (SLM) pixels in a lithography system configured to print a desired pattern, the instructions when executed by the one or more processors, cause the one or more processors to perform the steps of:
    determining diffraction orders associated with an ideal mask of a pattern to be printed by the lithography system; and
    configuring the states of the SLM pixels to match determined diffraction orders related to the desired pattern.

* * * * *